(12) United States Patent  (10) Patent No.: US 8,415,790 B2
Chen et al.  (45) Date of Patent: Apr. 9, 2013

(54) SEMICONDUCTOR PACKAGE HAVING PASSIVE DEVICE AND METHOD FOR MAKING THE SAME

(75) Inventors: Chien-Hua Chen, Kaohsiung (TW); Teck-Chong Lee, Kaohsiung (TW)

(73) Assignee: Advance Semiconductor Engineering, Inc., Kaohsiung (TW)

( * ) Notice: Subject to any disclaimer, the term of this patent is extended or adjusted under 35 U.S.C. 154(b) by 25 days.

(21) Appl. No.: 12/796,279

(22) Filed: Jun. 8, 2010

(65) Prior Publication Data

US 2011/0156246 A1    Jun. 30, 2011

(30) Foreign Application Priority Data

Dec. 31, 2009  (TW) .............................. 098146110 A

(51) Int. Cl.
*H01L 25/16* (2006.01)
*H01L 21/50* (2006.01)
(52) U.S. Cl. ......... 257/724; 257/E25.029; 257/E21.575; 257/E21.008; 257/E21.022; 257/E21.499; 257/531; 257/774
(58) Field of Classification Search .................. 257/531, 257/E25.029, E21.575, E21.008, E21.022, 257/724, E21.499; 438/110
See application file for complete search history.

(56) References Cited

U.S. PATENT DOCUMENTS

| | | | | |
|---|---|---|---|---|
| 4,886,200 A | * | 12/1989 | Tsumura | 228/1.1 |
| 5,060,051 A | * | 10/1991 | Usuda | 257/765 |
| 5,962,872 A | * | 10/1999 | Zhang et al. | 257/66 |
| 6,439,450 B1 | * | 8/2002 | Chapman et al. | 228/180.5 |
| 6,966,480 B2 | * | 11/2005 | Chapman et al. | 228/4.5 |
| 7,050,481 B1 | * | 5/2006 | Hulbert | 375/144 |
| 7,075,167 B2 | * | 7/2006 | Harris et al. | 257/531 |
| 7,214,606 B2 | * | 5/2007 | Wong et al. | 438/617 |
| 7,381,607 B2 | * | 6/2008 | Harris et al. | 438/210 |
| 2004/0238941 A1 | | 12/2004 | Satoh et al. | |
| 2006/0060852 A1 | | 3/2006 | Yamazaki et al. | |
| 2011/0156204 A1 | * | 6/2011 | Chen et al. | 257/531 |
| 2011/0156247 A1 | * | 6/2011 | Chen et al. | 257/724 |

FOREIGN PATENT DOCUMENTS

CN    101000898    7/2007

OTHER PUBLICATIONS

Office Action issued by the State Intellectual Property Office of China (SIPO) No. 200233, CN Application No. 201010118971.8; dated Oct. 18, 2012, 8 pages, and Summary of Office Action issued on Oct. 18, 2012, 2 pages.

* cited by examiner

*Primary Examiner* — A O Williams
(74) *Attorney, Agent, or Firm* — McCracken & Frank LLC

(57) ABSTRACT

The present invention relates to a semiconductor package and a method for making the same. The semiconductor package includes a substrate, a first capacitor, a first protective layer, a first metal layer and a second protective layer. The substrate has at least one via structure. The first capacitor is disposed on a first surface of the substrate. The first protective layer encapsulates the first capacitor. The first metal layer is disposed on the first protective layer, and includes a first inductor. The second protective layer encapsulates the first inductor. Whereby, the first inductor, the first capacitor and the via structure are integrated into the semiconductor package, so that the size of the product is reduced.

16 Claims, 19 Drawing Sheets

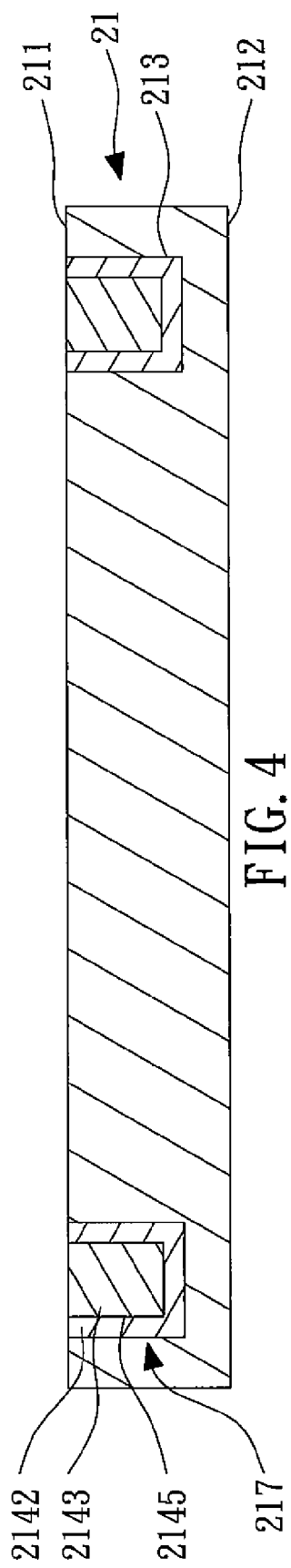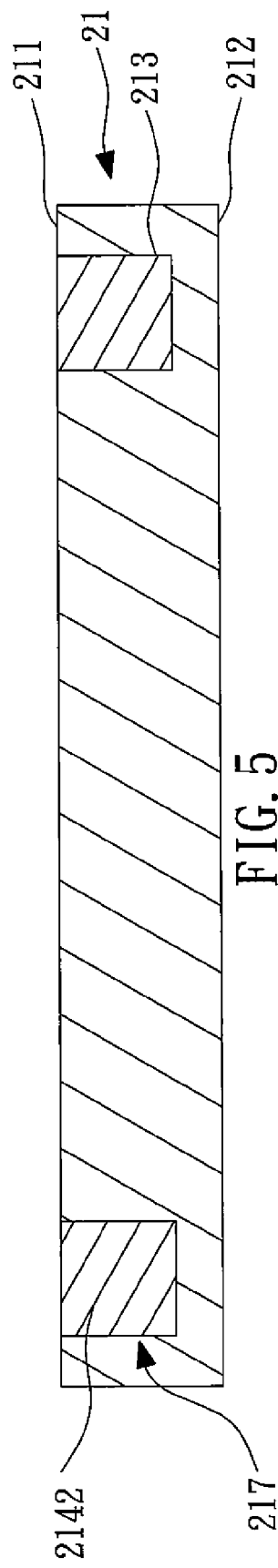

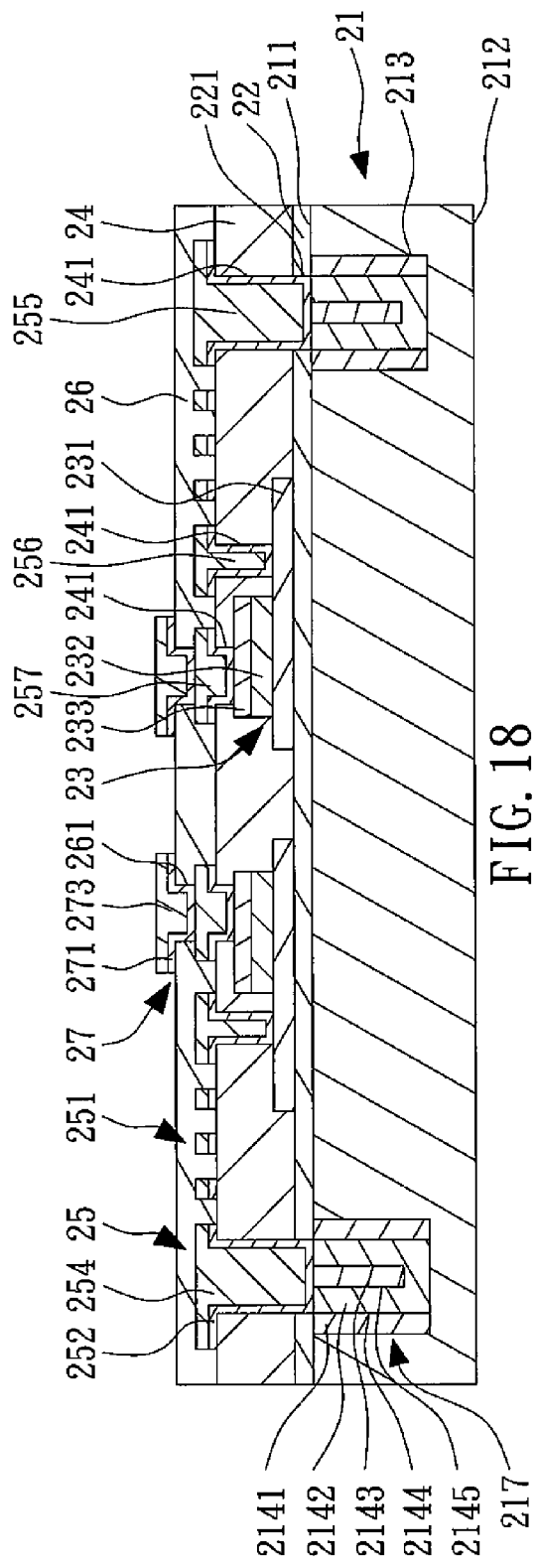
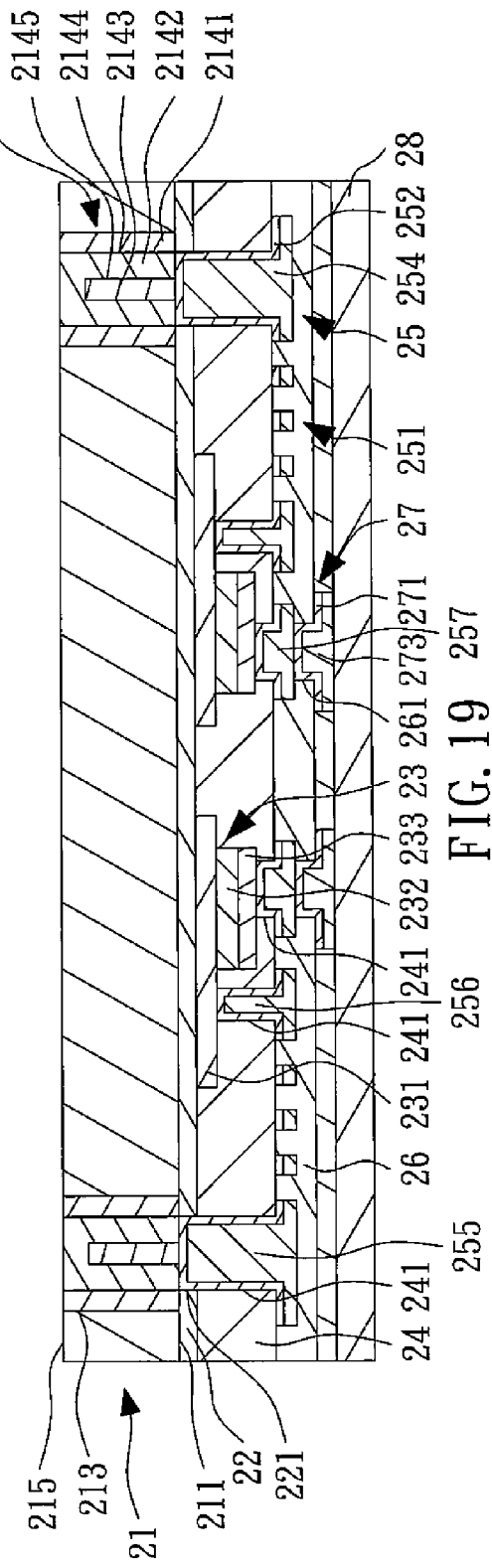
FIG. 18
FIG. 19

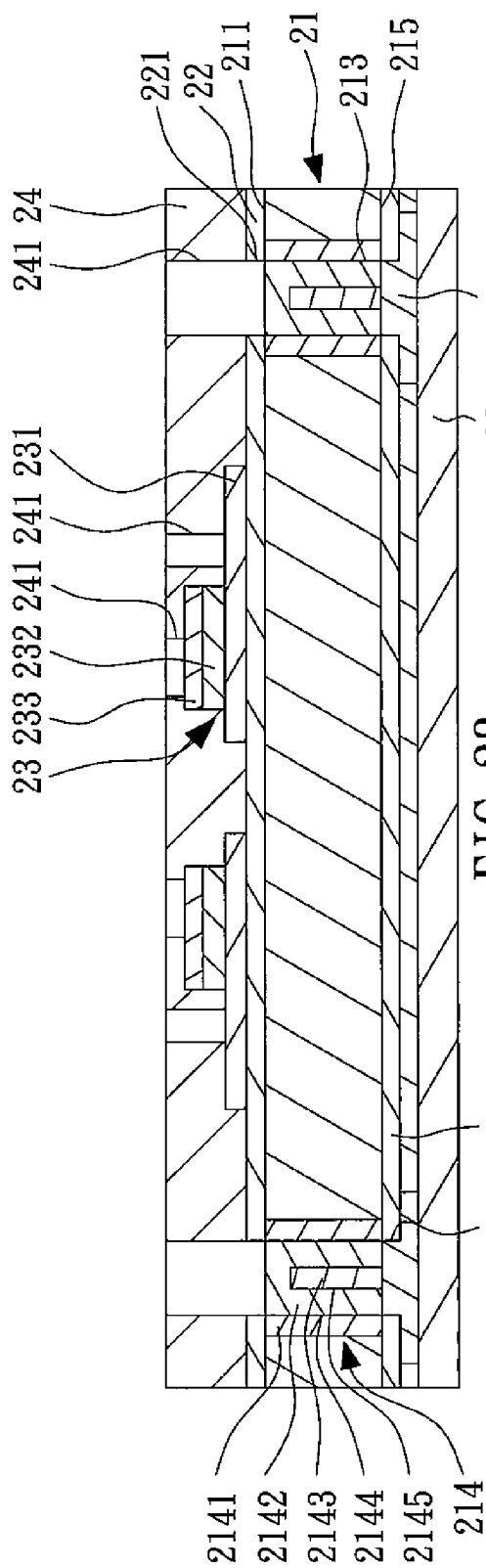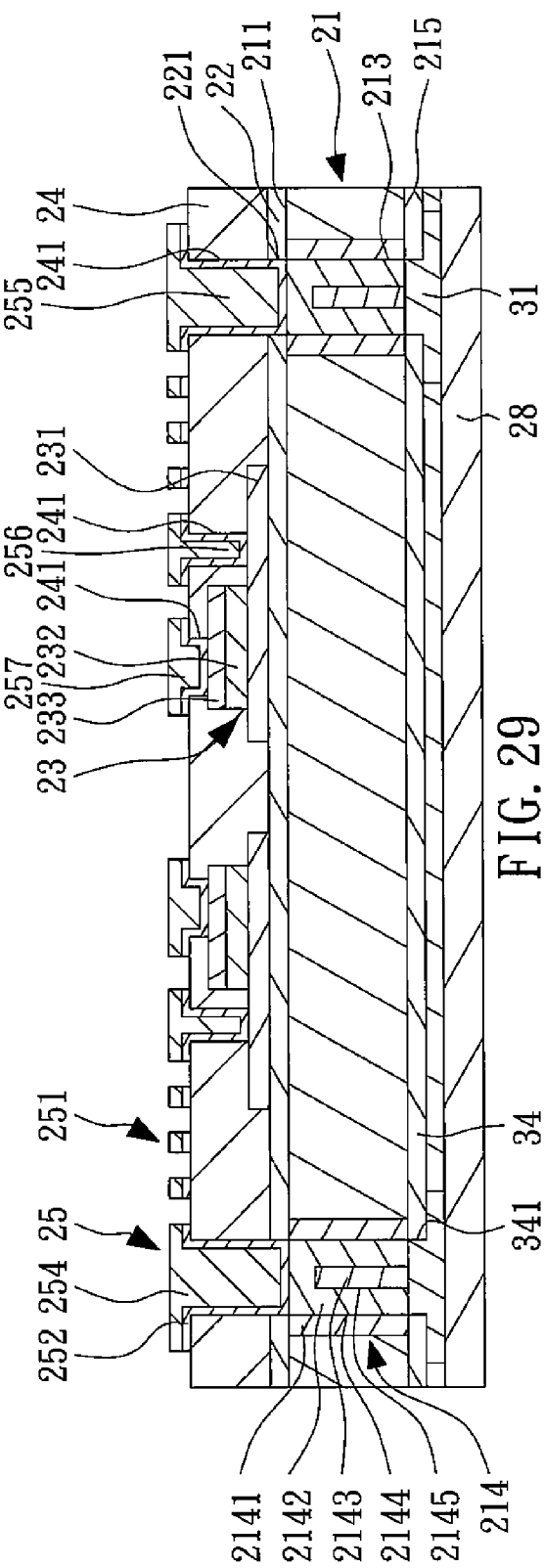

SEMICONDUCTOR PACKAGE HAVING PASSIVE DEVICE AND METHOD FOR MAKING THE SAME

BACKGROUND OF THE INVENTION

1. Field of the Invention

The present invention relates to a semiconductor package and a method for making the same, and more particularly, to a semiconductor package with passive devices and a method for making the same.

2. Description of the Related Art

FIG. 1 shows a cross-sectional view of a conventional semiconductor package. As shown in FIG. 1, the conventional semiconductor package 1 comprises a substrate 11, a packaged unit 12 and a molding compound 13. The packaged unit 12 comprises a plurality of passive devices (not shown). The packaged unit 12 is disposed on and is electrically connected to the substrate 11. The molding compound 13 encapsulates the packaged unit 12.

The conventional semiconductor package 1 has following defects. Since the passive devices are first integrated in the packaged unit 12 by using a semiconductor process and the packaged unit 12 is then electrically connected to the substrate 11 by wire bonding or flip-chip bonding (not shown), thus causing a complicated process of integrating the passive devices in the packaged unit 12 and a high production cost.

Consequently, there is an existing need for a semiconductor package and a method for making the same that solves the above-mentioned problems.

SUMMARY OF THE INVENTION

The present invention provides a method for making a semiconductor package. The method comprises the steps of: (a) providing a base material, wherein the base material comprises at least one groove and at least one conductive via structure; (b) forming a first capacitor on the base material, wherein the first capacitor comprises a first lower electrode, a first dielectric layer and a first upper electrode, the first lower electrode is disposed on the base material, the first dielectric layer is disposed on the first lower electrode, and the first upper electrode is disposed on the first dielectric layer; (c) forming a first protective layer, so as to encapsulate the first capacitor, wherein the first protective layer comprises a plurality of first openings, and the first openings expose the conductive via structure, part of the first lower electrode and part of the first upper electrode; (d) forming a first metal layer on the first protective layer, wherein the first metal layer comprises a first inductor, and directly contacts the conductive via structure, the first lower electrode and the first upper electrode; and (e) forming a second protective layer, so as to encapsulate the first inductor.

Whereby, the process of producing the first inductor and the first capacitor is simplified.

The present invention further provides a semiconductor package. The semiconductor package includes a base material, a first metal layer, a first dielectric layer, a first upper electrode and a first protective layer. The base material has a first surface and a second surface. The first metal layer is disposed on the first surface of the base material and includes a first inductor and a first lower electrode. The first dielectric layer is disposed on the first lower electrode. The first upper electrode is disposed on the first dielectric layer, and the first upper electrode, the first dielectric layer and the first lower electrode form a first capacitor. The first protective layer encapsulates the first inductor and the first capacitor.

The present invention further provides a semiconductor package. The semiconductor package includes a base material, a first capacitor, a first protective layer, a first metal layer and a second protective layer. The base material has a first surface, a second surface, at least one groove and at least one through via structure. The groove penetrates the first surface and the second surface, and the through via structure is disposed in the groove and exposed on the first surface and the second surface. The first capacitor is disposed on the first surface of the base material and comprises a first lower electrode, a first dielectric layer and a first upper electrode. The first lower electrode is disposed on the first surface of the base material, the first dielectric layer is disposed on the first lower electrode, and the first upper electrode is disposed on the first dielectric layer. The first protective layer encapsulates the first capacitor. The first protective layer comprises a plurality of first openings, and the first openings expose the through via structure, part of the first lower electrode and part of the first upper electrode. The first metal layer is disposed on the first protective layer, comprises a first inductor, and directly contacts the through via structure, the first lower electrode and the first upper electrode. The second protective layer encapsulates the first inductor.

Whereby, the first inductor, the first capacitor and the through via structure can be integrated into the semiconductor package, so that the size of the product is reduced.

BRIEF DESCRIPTION OF THE DRAWINGS

FIGS. 2-21 are schematic views of a first embodiment of a method for making a semiconductor package according to the present invention;

FIGS. 24-31 are schematic views of a fourth embodiment of a method for making a semiconductor package according to the present invention.

DETAILED DESCRIPTION OF THE INVENTION

Figure 1:
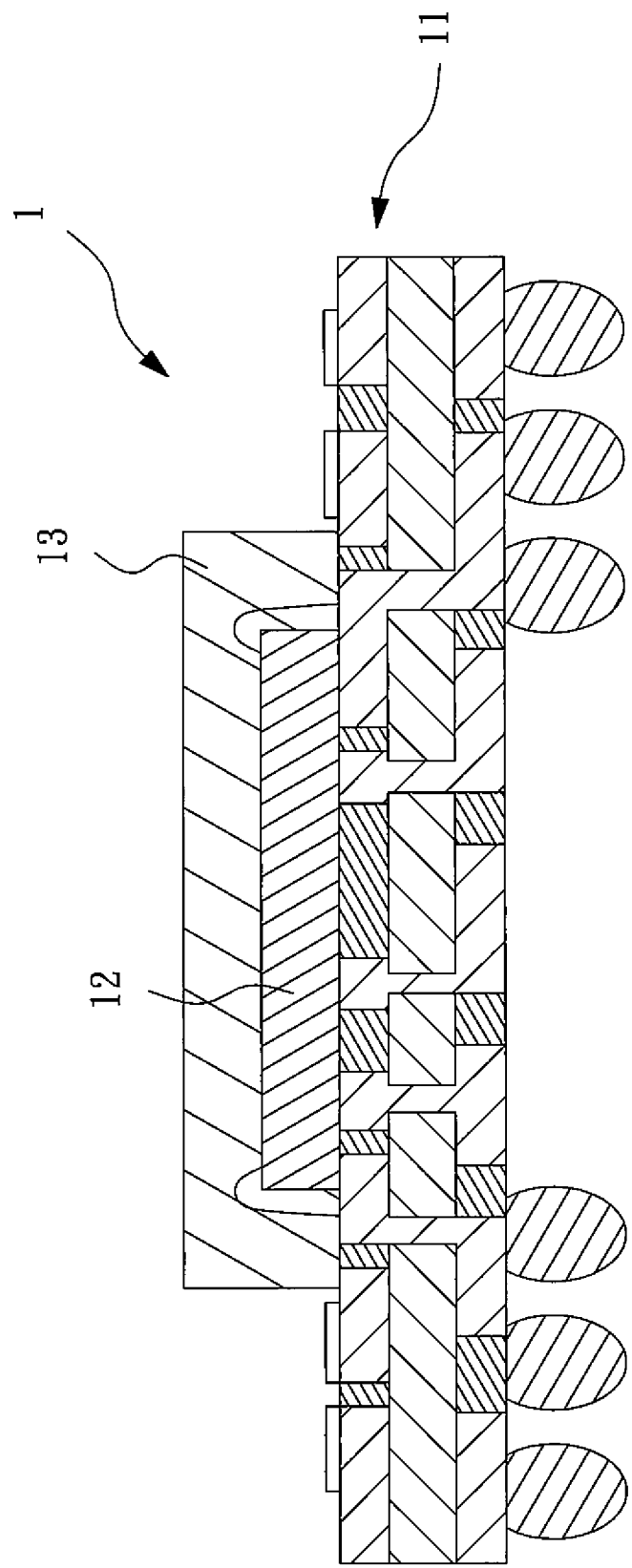
FIG. 1 is a cross-sectional view of a conventional semiconductor package.
Figure 2:
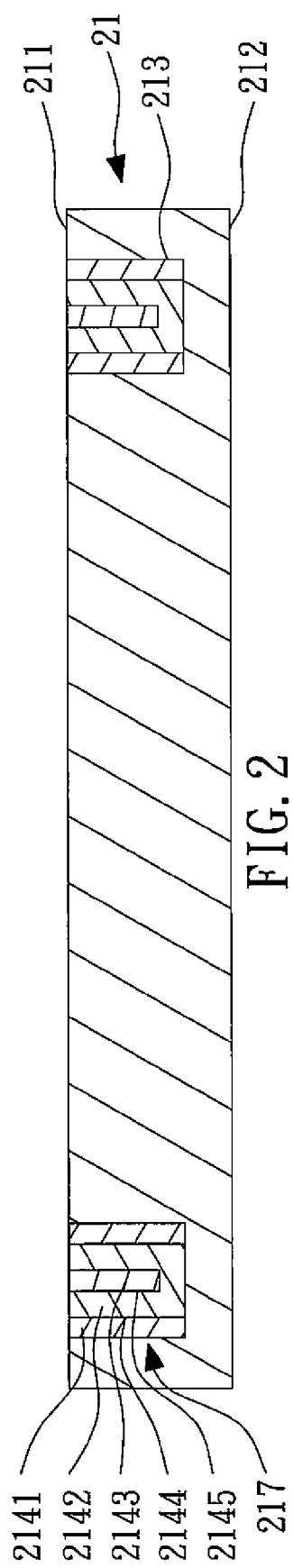

FIGS. 2-21 are schematic views of a first embodiment of a method for making a semiconductor package according to the present invention. As shown in FIG. 2, a base material 21 is provided. In this embodiment, the base material 21 comprises a first surface 211, a bottom surface 212, at least one groove 213 and at least one conductive via structure 217. The groove 213 opens at the first surface 211 of the base material 21. The conductive via structure 217 is disposed in the groove 213 and exposed on the first surface 211 of the base material 21.

In this embodiment, the base material 21 is made of non-insulation material such as silicon or germanium. The conductive via structure 217 comprises an outer insulation layer 2141, a conductor 2142 and an inner insulation layer 2143. The outer insulation layer 2141 is disposed on the side wall of the groove 213 to define a second central groove 2144, the conductor 2142 is disposed on the side wall of the second central groove 2144 so as to define a first central groove 2145, and the first central groove 2145 is filled with the inner insulation layer 2143. In other embodiments, the outer insulation layer 2141 can also be disposed on the bottom wall of the groove 213 (not shown). Since the base material 21 is made of non-insulation material, the outer insulation layer 2141 is used to insulate the base material 21 and the conductor 2142 to avoid the current which passes through the through via structure 214 being conducted to the base material 21 and reducing the electrical effects of the conductive via structure 217.

Figure 3:
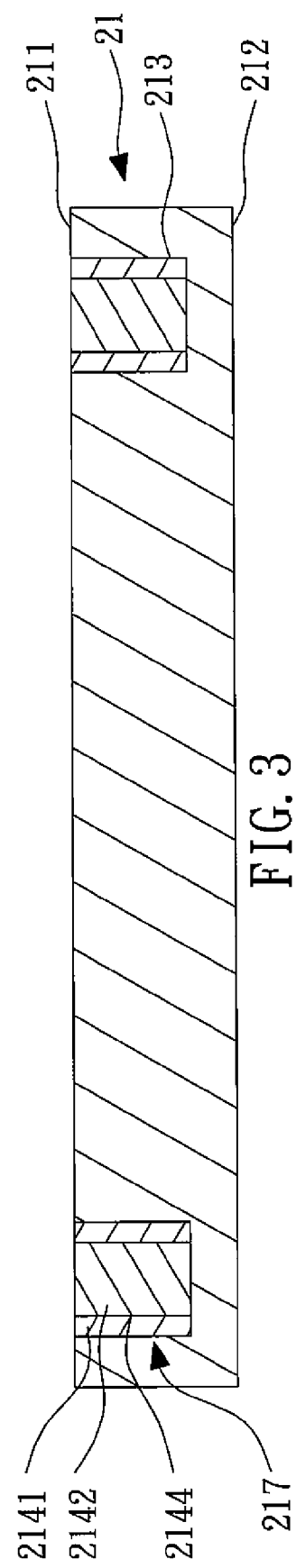
Figure 6:
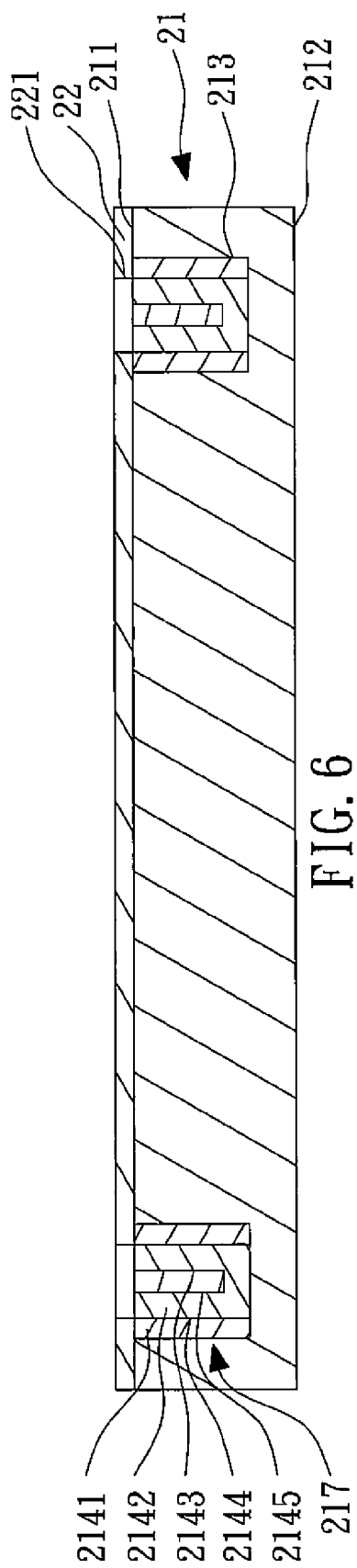
Figure 7:
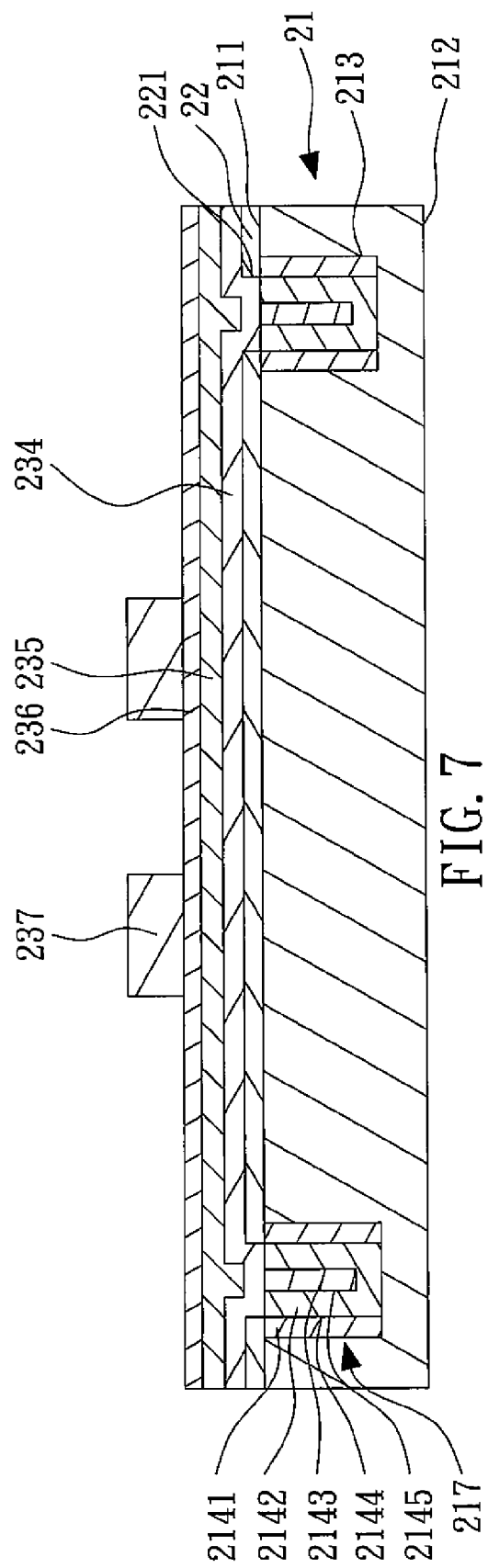
Figure 8:
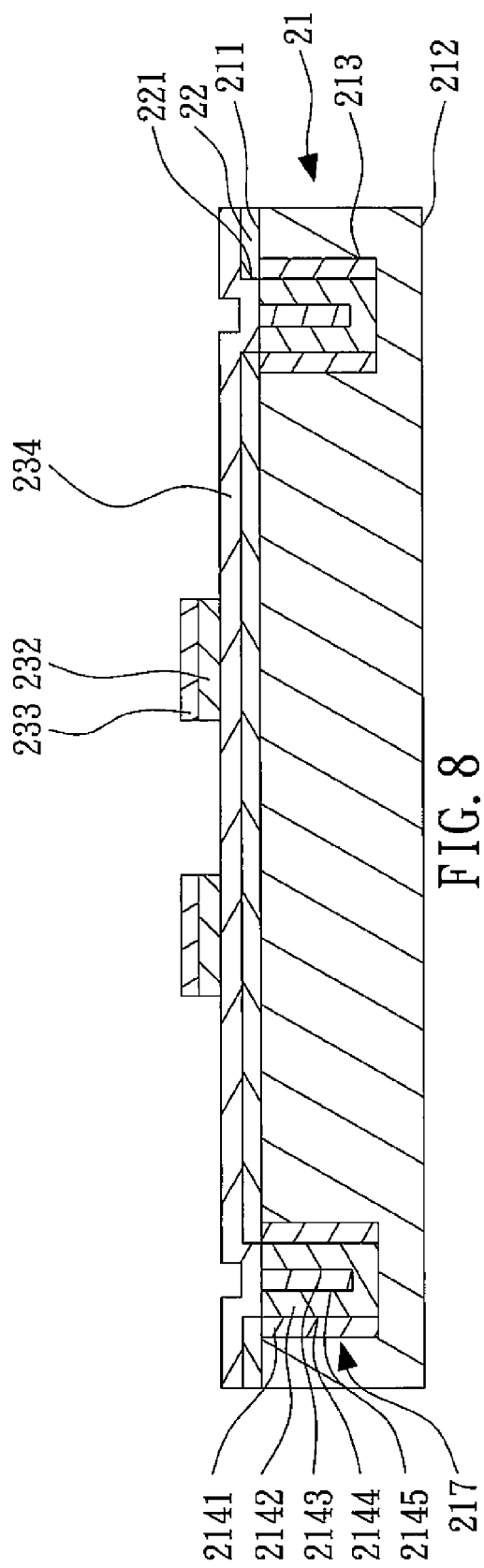
Figure 9:
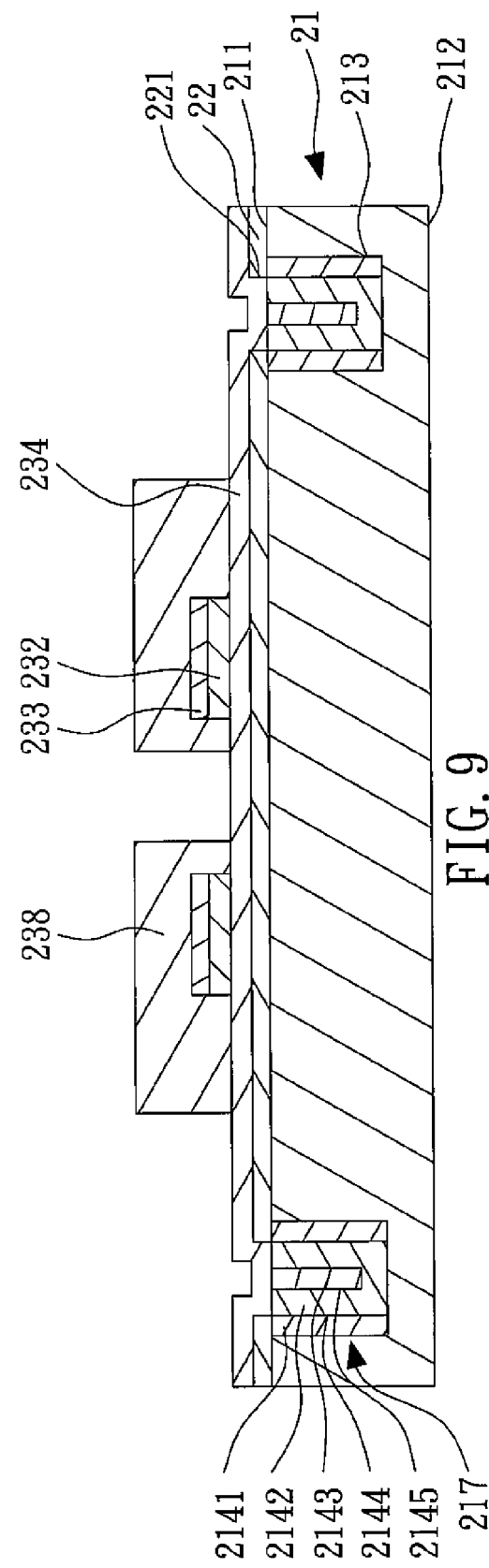
Figure 10:
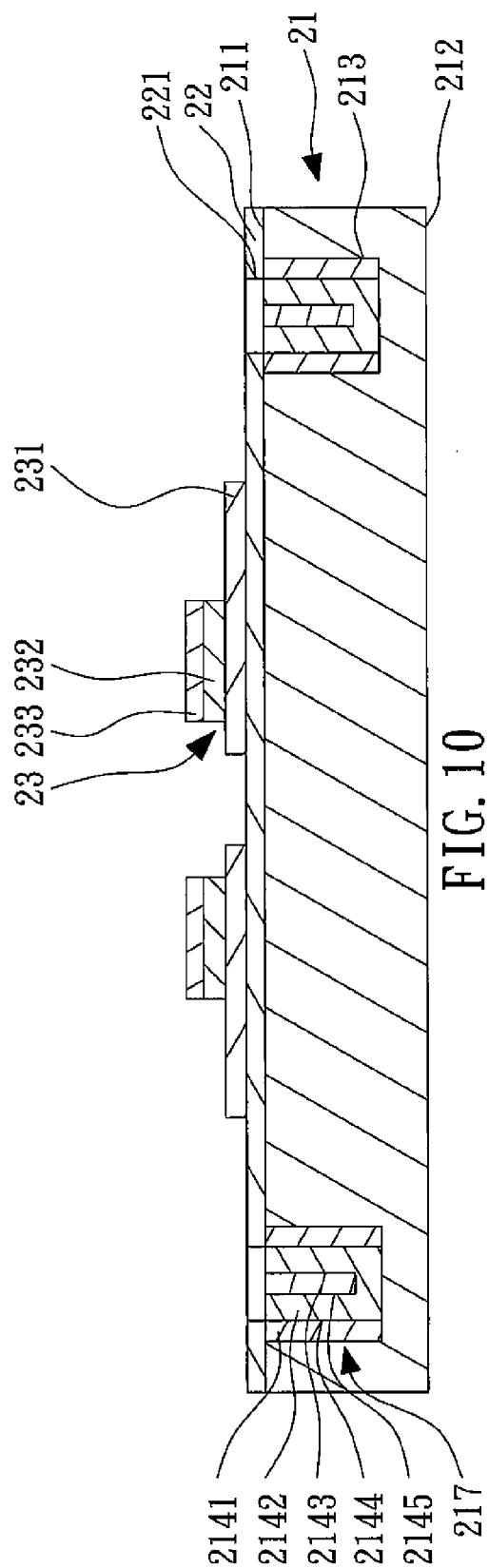
Figure 11:
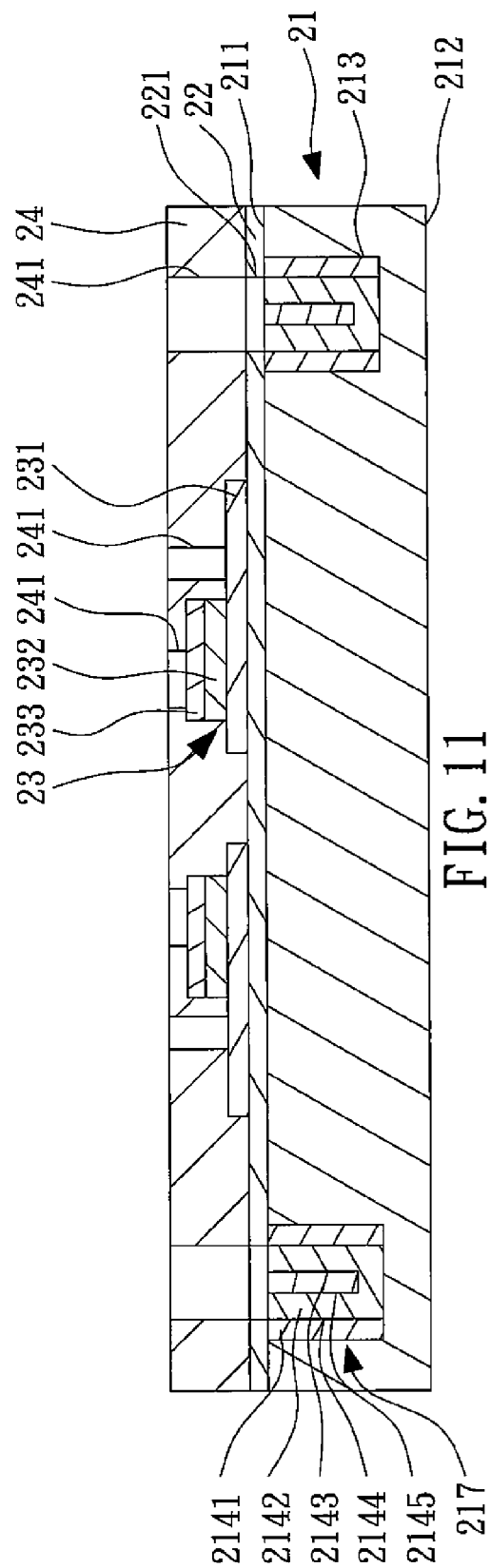

However, in other embodiments, as shown in FIG. 3, the conductive via structure 217 can only comprise an outer insulation layer 2141 and a conductor 2142 but does not comprise the inner insulation layer 2143 (FIG. 2). The outer insulation layer 2141 is disposed on the side wall of the groove 213 to define a second central groove 2144, and the second central groove 2144 is filled with the conductor 2142. In addition, the base material 21 can be made of insulation material such as glass or silica, and the conductive via structure 217 may not comprise the outer insulation layer 2141 (FIG. 2). Therefore, as shown in FIG. 4, the conductive via structure 217 can only comprise a conductor 2142 and an inner insulation layer 2143, wherein the conductor 2142 is disposed on the side wall and the bottom portion of the groove 213 to define a first central groove 2145, and the first central groove 2145 is filled with the inner insulation layer 2143. Alternatively, as shown in FIG. 5, the conductive via structure 217 can only comprise a conductor 2142, wherein the groove 213 is filled with the conductor 2142. As shown in FIG. 6, a first insulation layer 22 is formed on the base material 21. In this embodiment, the first insulation layer 22 is formed on the first surface 211 of the base material 21 and has a first through hole 221, and the first through hole 221 exposes the conductive via structure 217. However, in other embodiments, the first insulation layer 22 is not necessarily required.

Then, a first capacitor 23 (FIG. 10) is formed on the base material 21. The first capacitor 23 comprises a first lower electrode 231, a first dielectric layer 232 and a first upper electrode 233. The first lower electrode 231 is disposed on the base material 21, the first dielectric layer 232 is disposed on the first lower electrode 231, and the first upper electrode 233 is disposed on the first dielectric layer 232.

Figure 12:
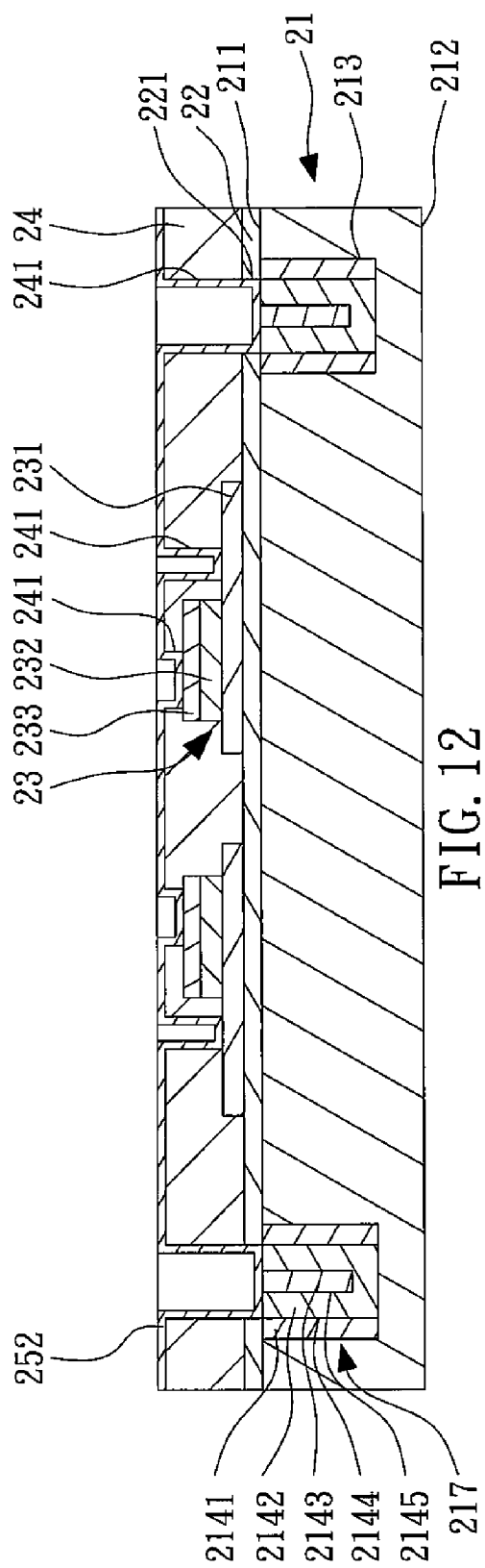
Figure 13:
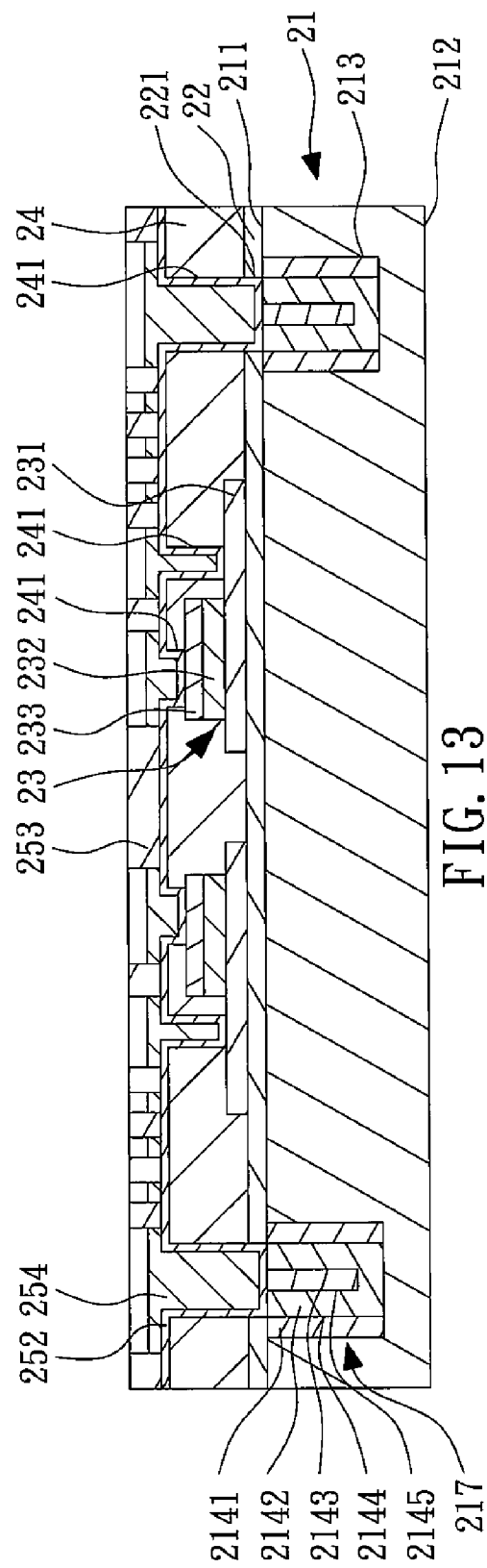
Figure 14:
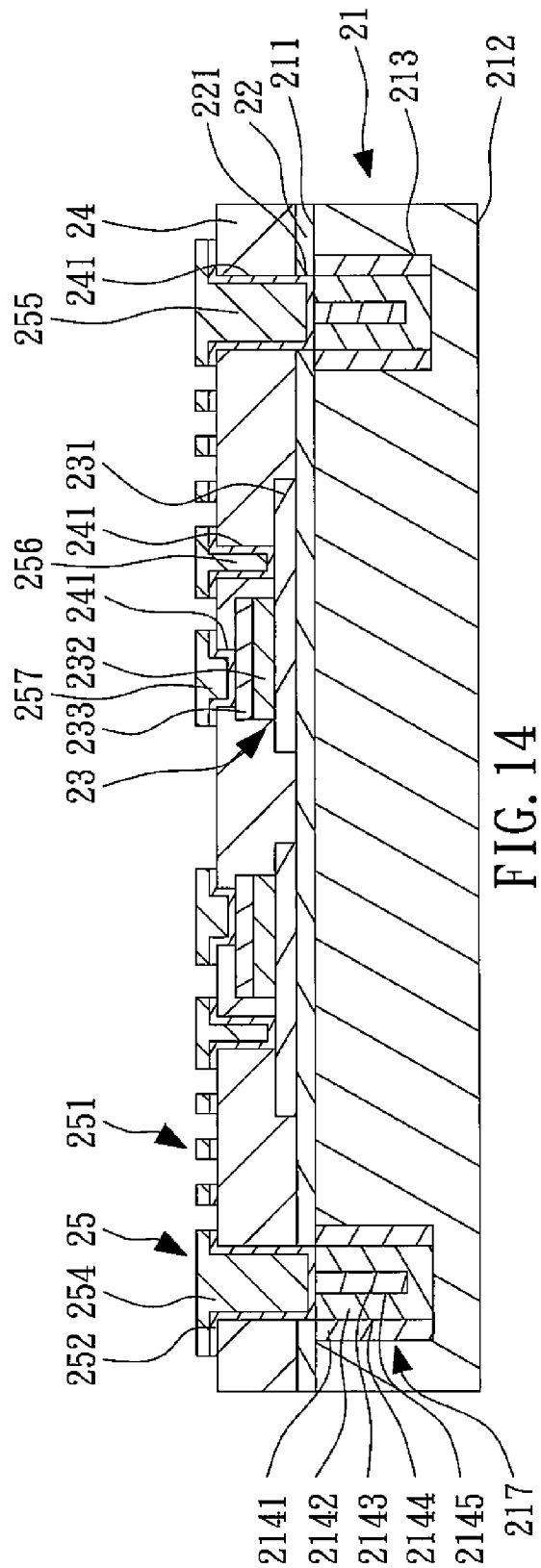
Figure 15:
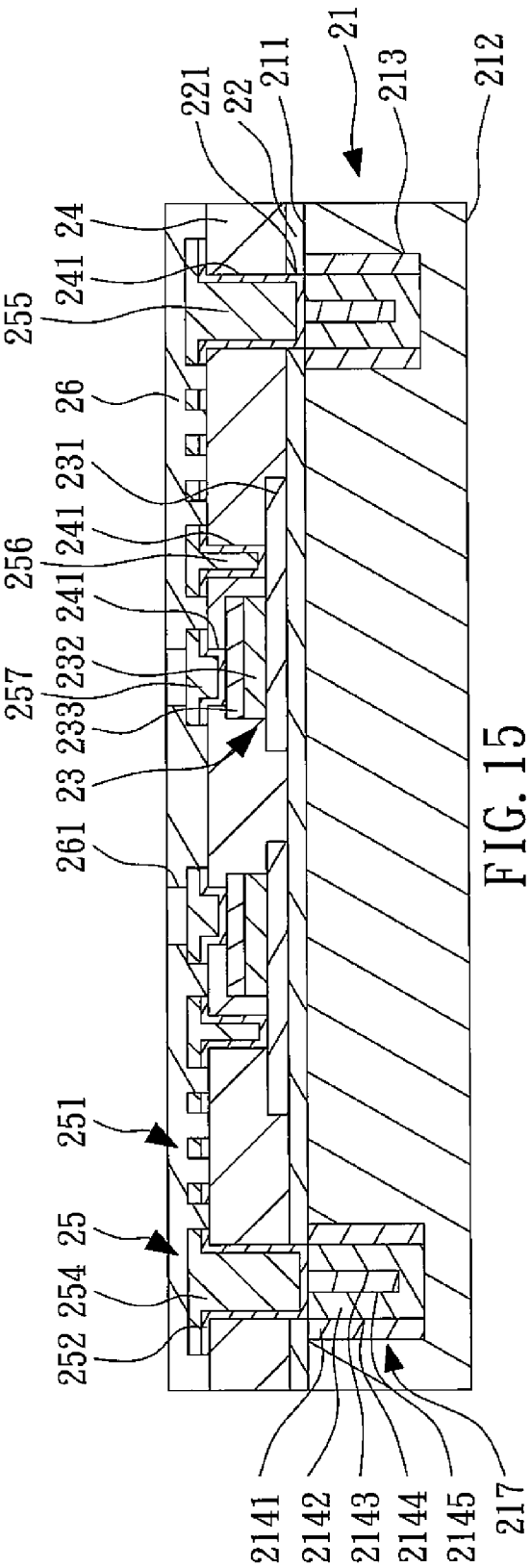

Then, a first metal layer 25 (FIG. 14) is formed on the first protective layer 24. The first metal layer 25 comprises a first inductor 251. Preferably, the first openings 241 are filled with the first metal layer 25, so as to form a first interconnection metal 255, a second interconnection metal 256 and a third interconnection metal 257. The first interconnection metal 255 directly contacts the conductive via structure 217, the second interconnection metal 256 directly contacts the first lower electrode 231, and the third interconnection metal 257 directly contacts the first upper electrode 233. In this embodiment, the steps of forming the first metal layer 25 are described as follows. As shown in FIG. 12, a first seed layer 252 is formed on the first protective layer 24. As shown in FIG. 13, a third photoresist 253 is formed on the first seed layer 252, so as to cover part of the first seed layer 252 and expose part of the first seed layer 252, and a first plated layer 254 is formed on the exposed part of the first seed layer 252. As shown in FIG. 14, the third photoresist 253 (FIG. 13) and the covered part of the first seed layer 252 are removed, and the first plated layer 254 and part of the first seed layer 252 form the first metal layer 25. As shown in FIG. 15, a second protective layer 26 is formed, so as to encapsulate the first inductor 251. The second protective layer 26 comprises at least one second opening 261, and the second opening 261 exposes part of the first metal layer 25.

Figure 16:
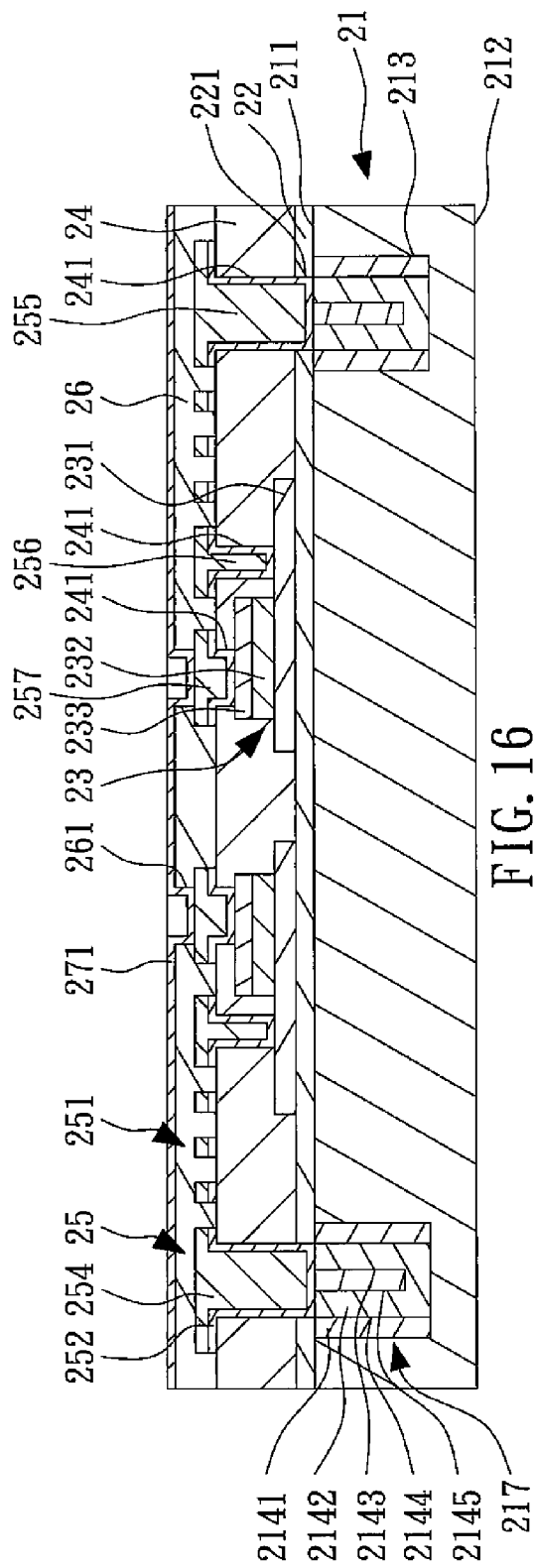
Figure 17:
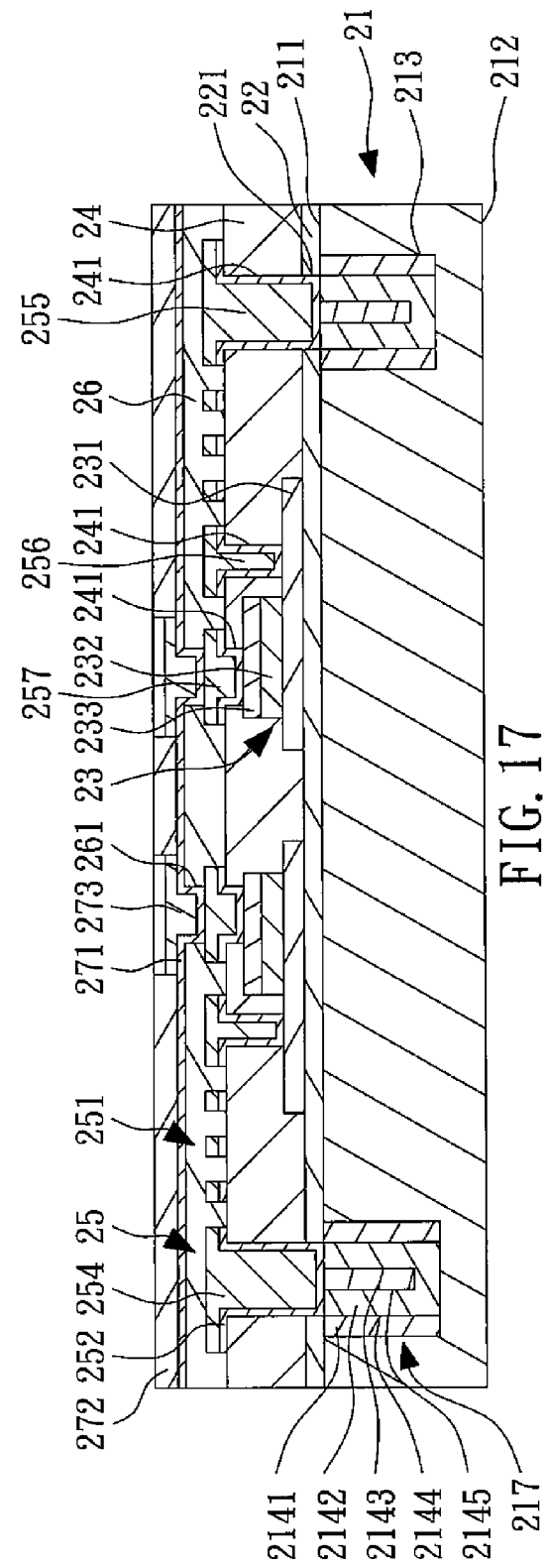

Then, at least one first bump 27 (FIG. 18) is formed in the second opening 261 of the second protective layer 26. In this embodiment, the steps of forming the first bump 27 are described as follows. As shown in FIG. 16, a second seed layer 271 is formed on the second protective layer 26. As shown in FIG. 17, a fourth photoresist 272 is formed on the second seed layer 271, so as to cover part of the second seed layer 271 and expose part of the second seed layer 271, and a second plated layer 273 is formed on the exposed part of the second seed layer 271. As shown in FIG. 18, the fourth photoresist 272 (FIG. 17) and the covered part of the second seed layer 271 are removed, so as to form the first bump 27.

As shown in FIG. 19, the base material 21 is disposed on a carrier 28, wherein the first surface 211 of the base material 21 faces the carrier 28. Part of the base material 21 is removed from the bottom surface 212 (FIG. 18), to form a second surface 215 and expose the conductor 2142 of the conductive via structure 217 (FIG. 18) on the second surface 215, so as to form a through via structure 214. However, in other embodiments, more part of the base material 21 can be further removed, so that the inner insulation layer 2143 of the conductive via structure 217 (FIG. 18) is also exposed on the second surface 215, which can ensure that the conductor 2142 is exposed on the second surface 215.

Figure 20:
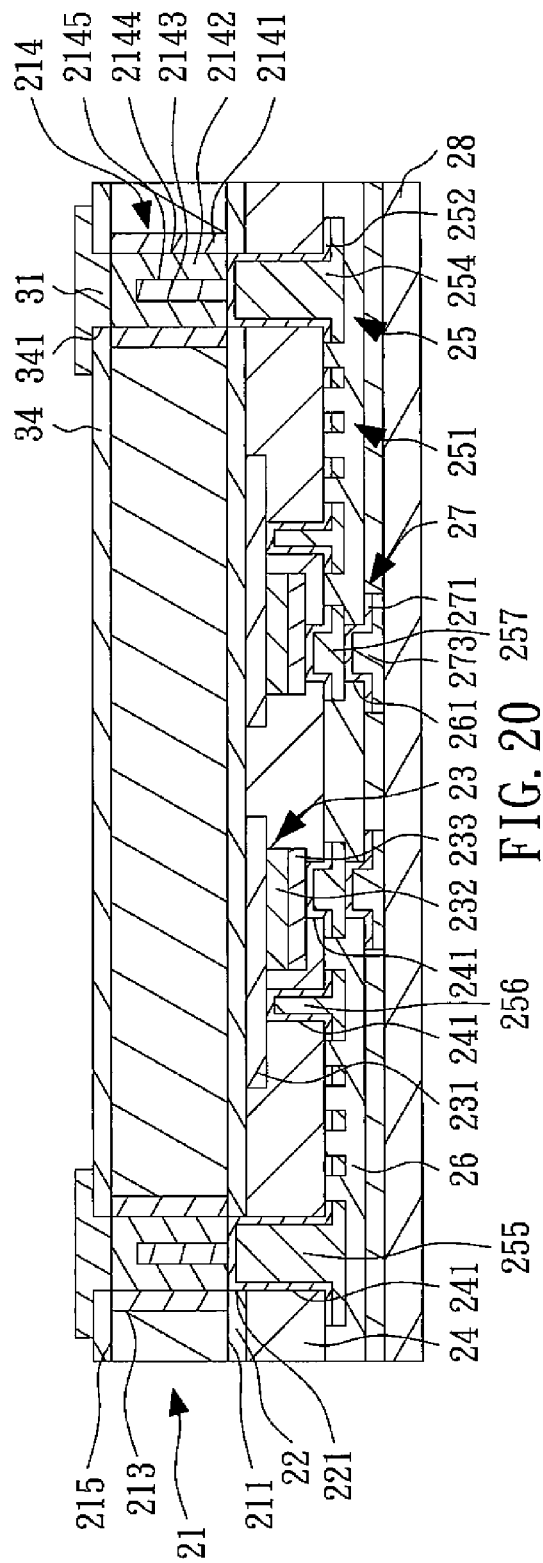
Figure 21:
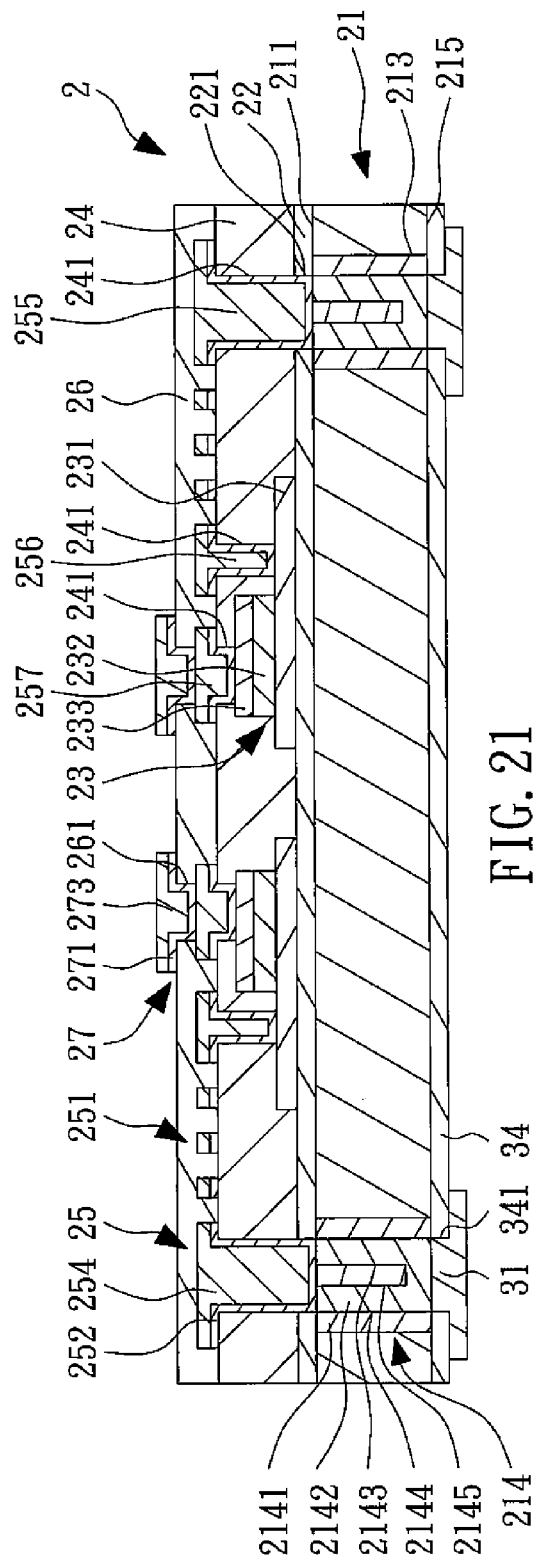
Figure 22:
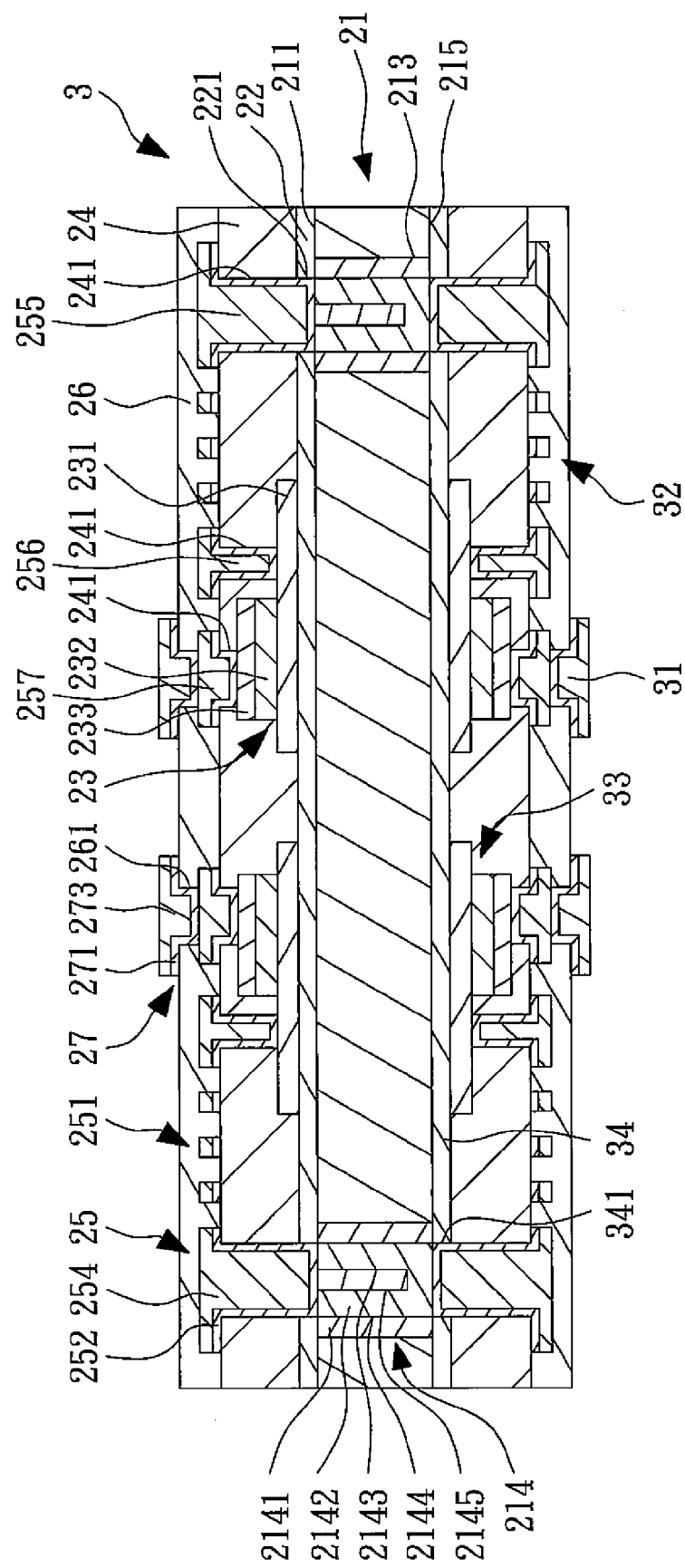
FIG. 22 is a cross-sectional view of a second embodiment of a semiconductor package according to the present invention.

As shown in FIG. 20, at least one electrical device is formed on the second surface 215 of the base material 21. In this embodiment, the electrical device is a second bump 31, and the method for making the second bump 31 is the same as that for making the first bump 27 and therefore not described in detail. As shown in FIG. 21, the carrier 28 (FIG. 20) is removed, and a semiconductor package 2 according to a first embodiment of the present invention is made. However, the electrical device can be a second inductor 32 and a second capacitor 33, as shown in FIG. 22. The method for making the second inductor 32 and the second capacitor 33 is the same as that for making the first inductor 251 and the first capacitor 23. That is, the manufacturing process applied to the second surface 215 of the base material 21 is the same as that applied to the first surface 211 of the base material 21 and therefore not described in detail.

As a result, the process of producing the first inductor 251 and the first capacitor 23 is simplified, and the first inductor 251, the first capacitor 23 and the through via structure 214 can be integrated into the semiconductor package 2, so that the size of the product is reduced.

FIG. 21 is a cross-sectional view of a first embodiment of the semiconductor package according to the present invention. As shown in FIG. 21, the semiconductor package 2 includes a base material 21, a first insulation layer 22, a second insulation layer 34, a first capacitor 23, a first protective layer 24, a first metal layer 25, a second protective layer 26, at least one first bump 27 and at least one electrical device.

The base material 21 comprises a first surface 211, a second surface 215, at least one groove 213 and at least one through via structure 214. The groove 213 penetrates the first surface 211 and the second surface 215. The through via structure 214 is disposed in the groove 213 and exposed on the first surface 211 and the second surface 215.

In this embodiment, the base material 21 is made of non-insulation material such as silicon or germanium. The through via structure 214 comprises an outer insulation layer 2141, a conductor 2142 and an inner insulation layer 2143. The outer insulation layer 2141 is disposed on the side wall of the groove 213 to define a second central groove 2144, the conductor 2142 is disposed on the side wall of the second central groove 2144 so as to define a first central groove 2145, and the first central groove 2145 is filled with the inner insulation layer 2143. In other embodiments, the outer insulation layer 2141 can also be disposed on the bottom wall of the groove 213 (not shown). Since the base material 21 is made of non-insulation material, the outer insulation layer 2141 is used to insulate the base material 21 and the conductor 2142 to avoid the current which passes through the through via structure 214 being conducted to the base material 21 and reducing the electrical effects of the through via structure 214.

However, in other embodiments, the through via structure 214 can only comprise an outer insulation layer 2141 and a conductor 2142 but does not comprise the inner insulation layer 2143. The outer insulation layer 2141 is disposed on the side wall of the groove 213 to define a second central groove 2144, and the second central groove 2144 is filled with the conductor 2142. In addition, the base material 21 can be made of insulation material such as glass or silica, and the through via structure 214 may not comprise the outer insulation layer 2141. Therefore, the through via structure 214 can only comprise a conductor 2142 and an inner insulation layer 2143, wherein the conductor 2142 is disposed on the side wall of the groove 213 to define a first central groove 2145, and the first central groove 2145 is filled with the inner insulation layer 2143. Alternatively, the through via structure 214 can only comprise a conductor 2142, and the groove 213 is filled with the conductor 2142.

The first insulation layer 22 is formed on the first surface 211 of the base material 21 and has a first through hole 221, and the first through hole 221 exposes the through via structure 214. The second insulation layer 34 is disposed on the second surface 215 of the base material 21 and has a second through hole 341, and the second through hole 341 exposes the through via structure 214. The first capacitor 23 is formed on the first insulation layer 22 and comprises a first lower electrode 231, a first dielectric layer 232 and a first upper electrode 233. The first lower electrode 231 is disposed on the first insulation layer 22, the first dielectric layer 232 is disposed on the first lower electrode 231, and the first upper electrode 233 is disposed on the first dielectric layer 232. In this embodiment, the first lower electrode 231 and the first upper electrode 233 are made of AlCu, and the first dielectric layer 232 is made of tantalum pentoxide ($Ta_2O_5$).

The first protective layer 24 encapsulates the first capacitor 23. In this embodiment, the first protective layer 24 comprises a plurality of first openings 241, and the first openings 241 expose the through via structure 214, part of the first lower electrode 231 and part of the first upper electrode 233. The first metal layer 25 is formed on the first protective layer 24 and comprises a first inductor 251. Preferably, part of the first metal layer 25 in the first openings forms a first interconnection metal 255, a second interconnection metal 256 and a third interconnection metal 257. The first interconnection metal 255 directly contacts the through via structure 214, the second interconnection metal 256 directly contacts the first lower electrode 231, and the third interconnection metal 257 directly contacts the first upper electrode 233. The second protective layer 26 encapsulates the first inductor 251. In this embodiment, the second protective layer 26 comprises at least one second opening 261, and the second opening 261 exposes part of the first metal layer 25. The first bump 27 is disposed in the second opening 261 of the second protective layer 26. The electrical device is disposed on the second surface 215 of the base material 21. The electrical device is a second bump.

As a result, the first inductor 251, the first capacitor 23 and the through via structure 214 can be integrated into the semiconductor package 2, so that the size of the product is reduced.

FIG. 22 is a cross-sectional view of a second embodiment of the semiconductor package according to the present invention. As shown in FIG. 22, the semiconductor package 3 of the third embodiment and the semiconductor package 2 (FIG. 21) of the first embodiment are substantially the same, and the same elements are designated with the same numerals. The difference between the second embodiment and the first embodiment is that the second surface 215 of the semiconductor package 3 comprises a plurality of electrical devices such as a second inductor 32, a second capacitor 33 and a second bump 31.

Figure 23:
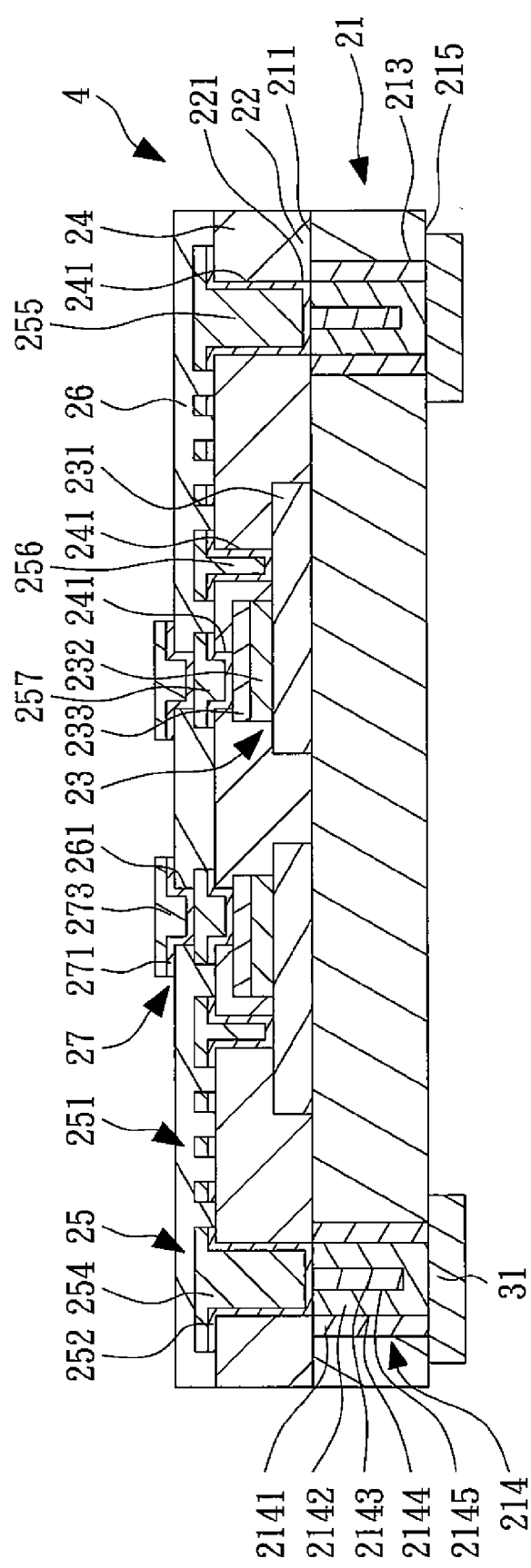
FIG. 23 is a cross-sectional view of a third embodiment of a semiconductor package according to the present invention.

FIG. 23 is a cross-sectional view of a third embodiment of the semiconductor package according to the present invention. As shown in FIG. 23, the semiconductor package 4 of the second embodiment and the semiconductor package 2 (FIG. 21) of the first embodiment are substantially the same, and the same elements are designated with the same numerals. The difference between the third embodiment and the first embodiment is that the semiconductor package 4 does not comprise the first insulation layer 22 and the second insulation layer 34, and preferably, the first capacitor 23 is disposed on the first surface 211 of the base material 21.

Figure 24:
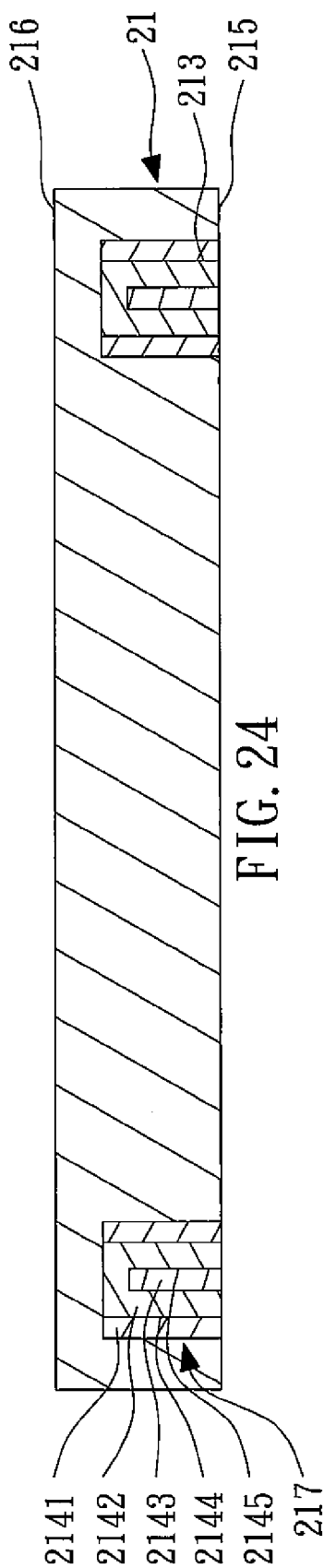
Figure 25:
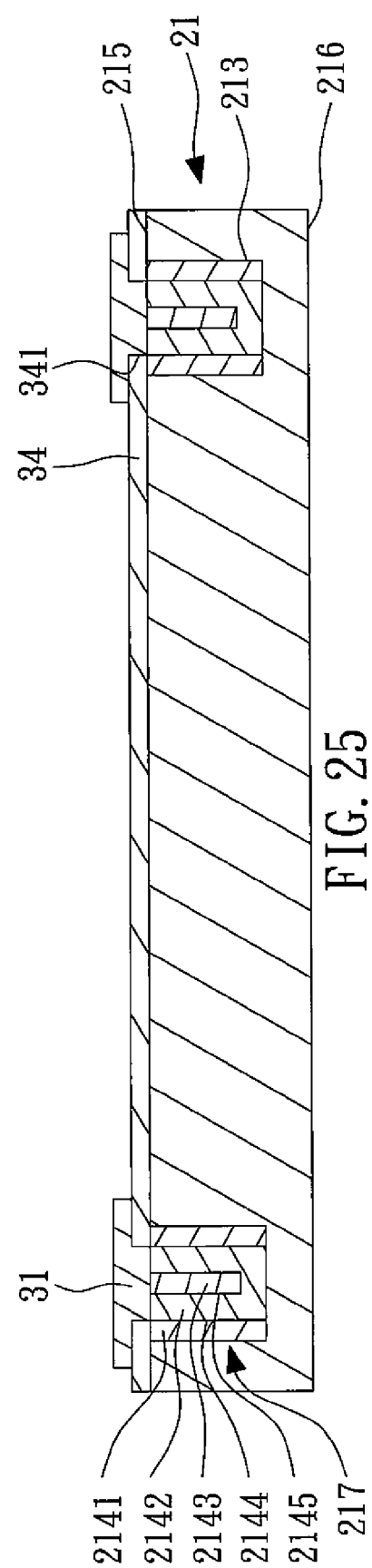
Figure 26:
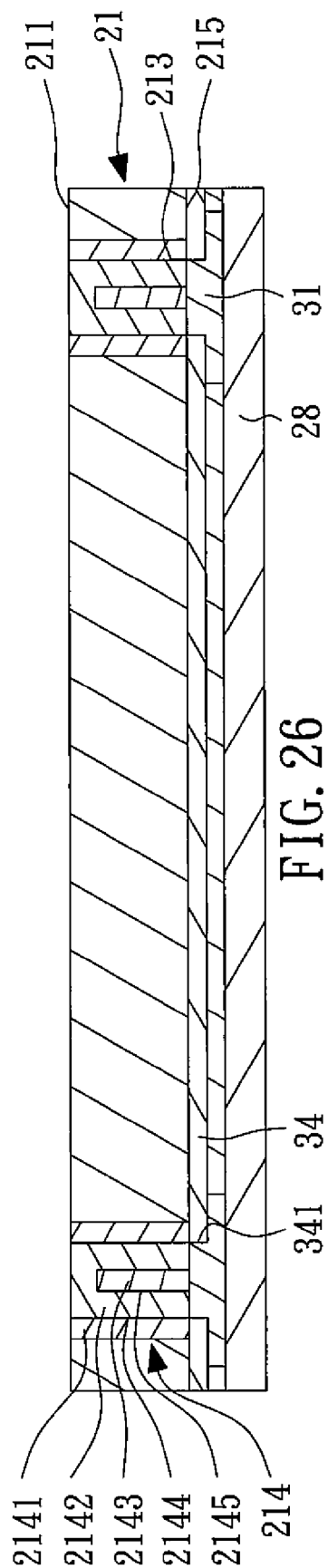

FIGS. 24-31 are schematic views of a fourth embodiment of a method for making a semiconductor package according to the present invention. As shown in FIG. 24, a base material 21 is provided. In this embodiment, the base material 21 comprises a top surface 216 and a second surface 215. The groove 213 opens at the second surface 215 of the base material 21, and the conductive via structure 217 is exposed on the second surface 215 of the base material 21. As shown in FIG. 25, a second insulation layer 34 is disposed on the base material 21. In this embodiment, the second insulation layer 34 is disposed on the second surface 215 of the base material 21 and has a second through hole 341, wherein the second through hole 341 exposes the conductive via structure 217. Then, at least one electrical device is formed on the second surface 215 of the base material 21, preferably on the second insulation layer 34. In this embodiment, the electrical device is a second bump 31. As shown in FIG. 26, the base material 21 is disposed on a carrier 28, wherein the second surface 215 of the base material 21 faces the carrier 28. Part of the base material 21 is removed from the top surface 216 (FIG. 25), to form a first surface 211 and expose the conductive via structure 217 (FIG. 25) on the first surface 211, so as to form a through via structure 214.

Figure 27:
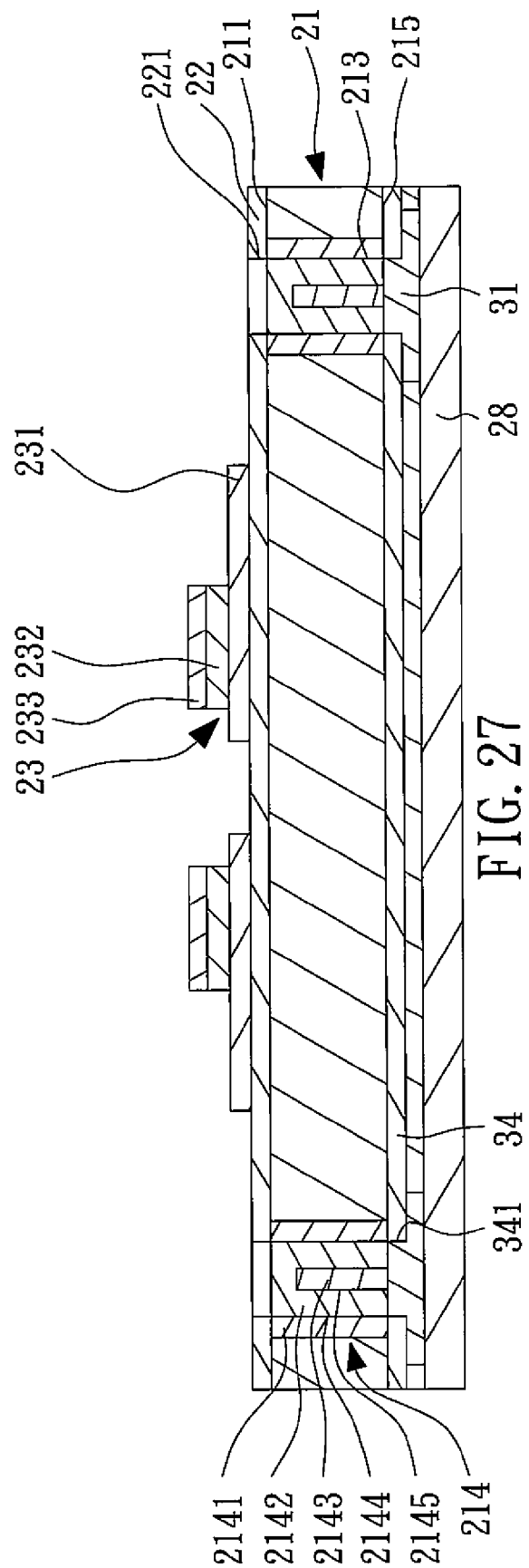
Figure 30:
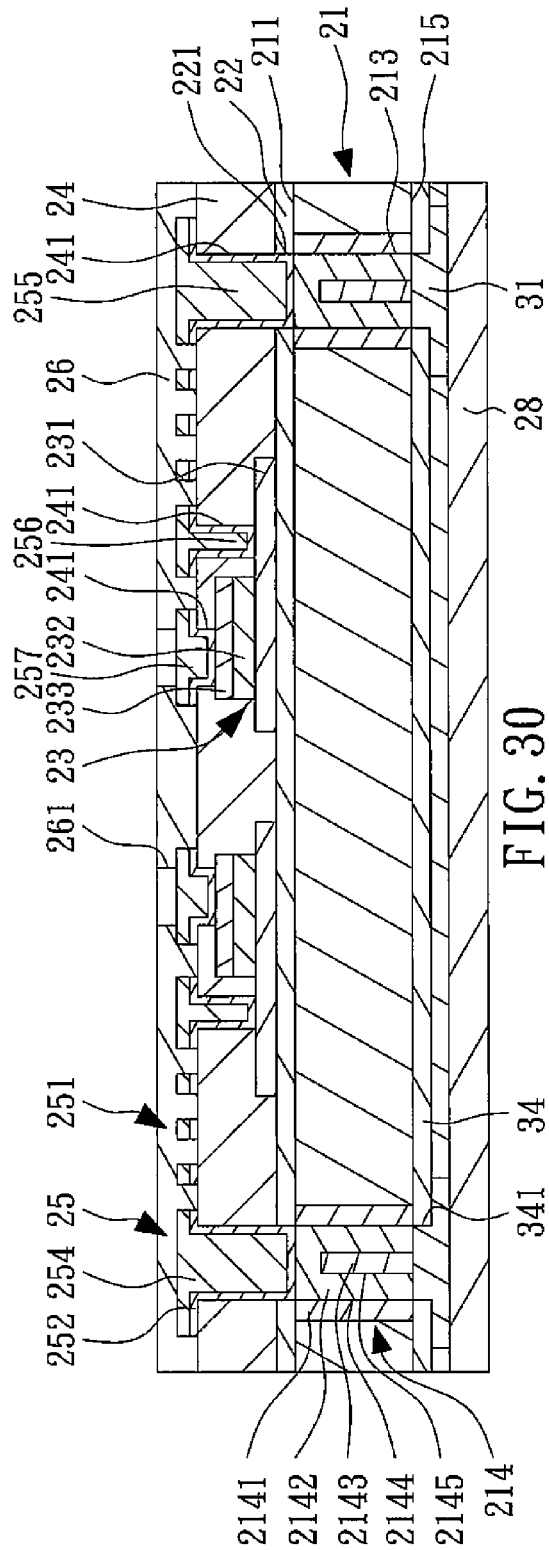
Figure 31:
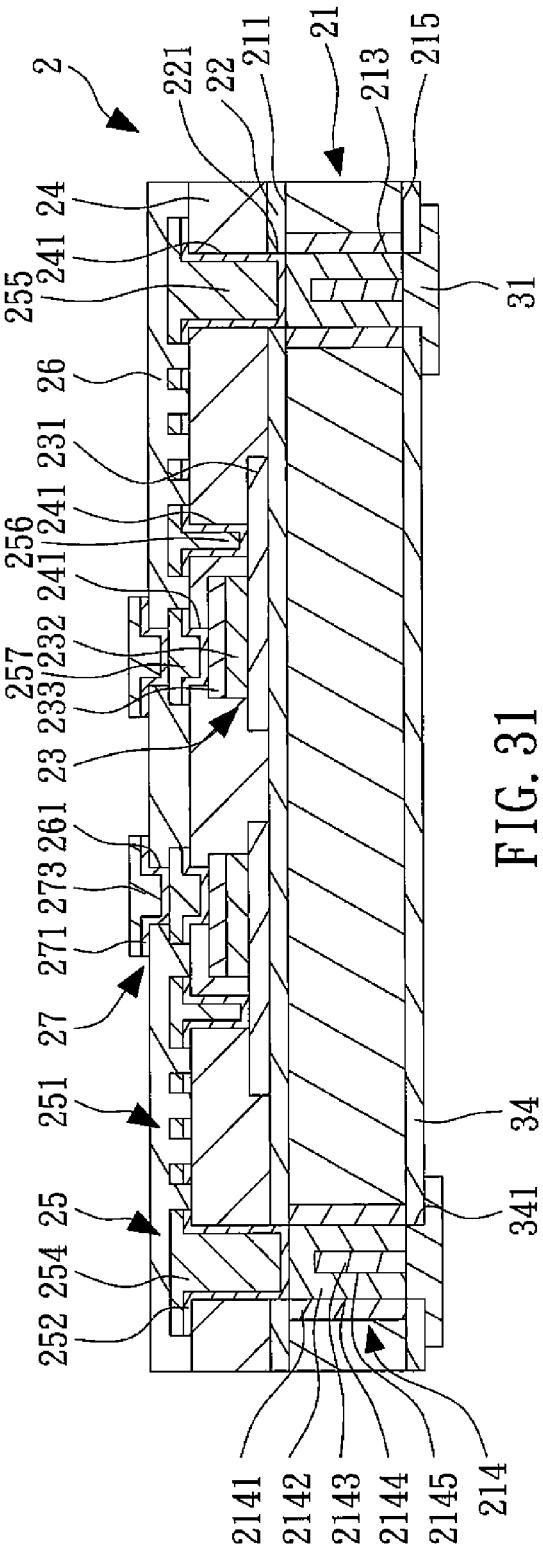

As shown in FIG. 27, a first capacitor 23 is formed on the base material 21. The first capacitor 21 comprises a first lower electrode 231, a first dielectric layer 232 and a first upper electrode 233. The first lower electrode 231 is disposed on the base material 21, the first dielectric layer 232 is disposed on the first lower electrode 231, and the first upper electrode 233 is disposed on the first dielectric layer 232. In this embodiment, the first capacitor 23 is formed on the first insulation layer 22. As shown in FIG. 28, a first protective layer 24 is formed, so as to encapsulate the first capacitor 23. The first protective layer 24 comprises a plurality of first openings 241, and the first openings 241 expose the through via structure 214, part of the first lower electrode 231 and part of the first upper electrode 233. As shown in FIG. 29, a first metal layer 25 is formed on the first protective layer 24. A first plated layer 254 and a first seed layer 252 form the first metal layer 25. The first metal layer 25 comprises a first inductor 251. Preferably, the first openings 241 are filled with the first metal layer 25, so as to form a first interconnection metal 255, a second interconnection metal 256 and a third interconnection metal 257. The first interconnection metal 255 directly contacts the through via structure 214, the second interconnection metal 256 directly contacts the first lower electrode 231, and the third interconnection metal 257 directly contacts the first upper electrode 233. As shown in FIG. 30, a second protective layer 26 is formed, so as to encapsulate the first inductor 251. The second protective layer 26 comprises at least one second opening 261, and the second opening 261 exposes part of the first metal layer 25. As shown in FIG. 31, at least one first bump 27 is formed in the second opening 261 of the second protective layer 26, and a second plated layer 273 and a second seed layer 271 form the first bump 27. Then, the carrier 28 is removed, and the semiconductor package 2 is made.

Figure 32:
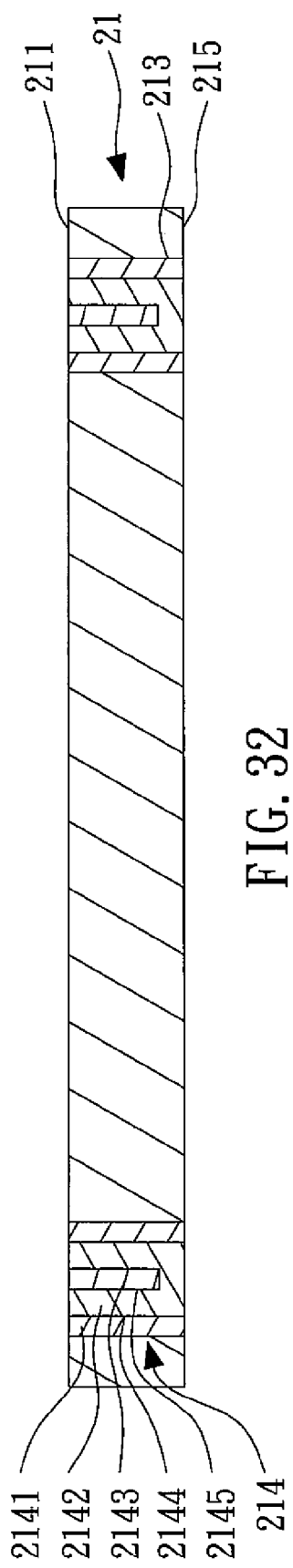
FIGS. 32-34 are schematic views of a fifth embodiment of a method for making a semiconductor package according to the present invention.
Figure 33:
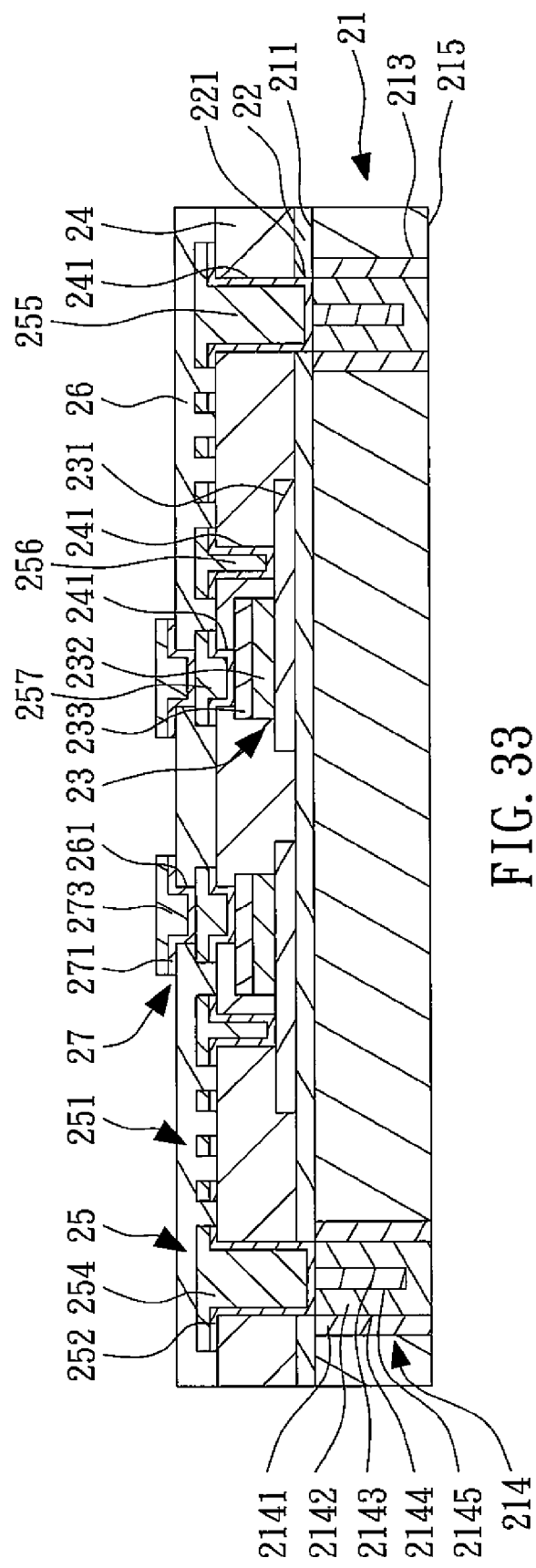
Figure 34:
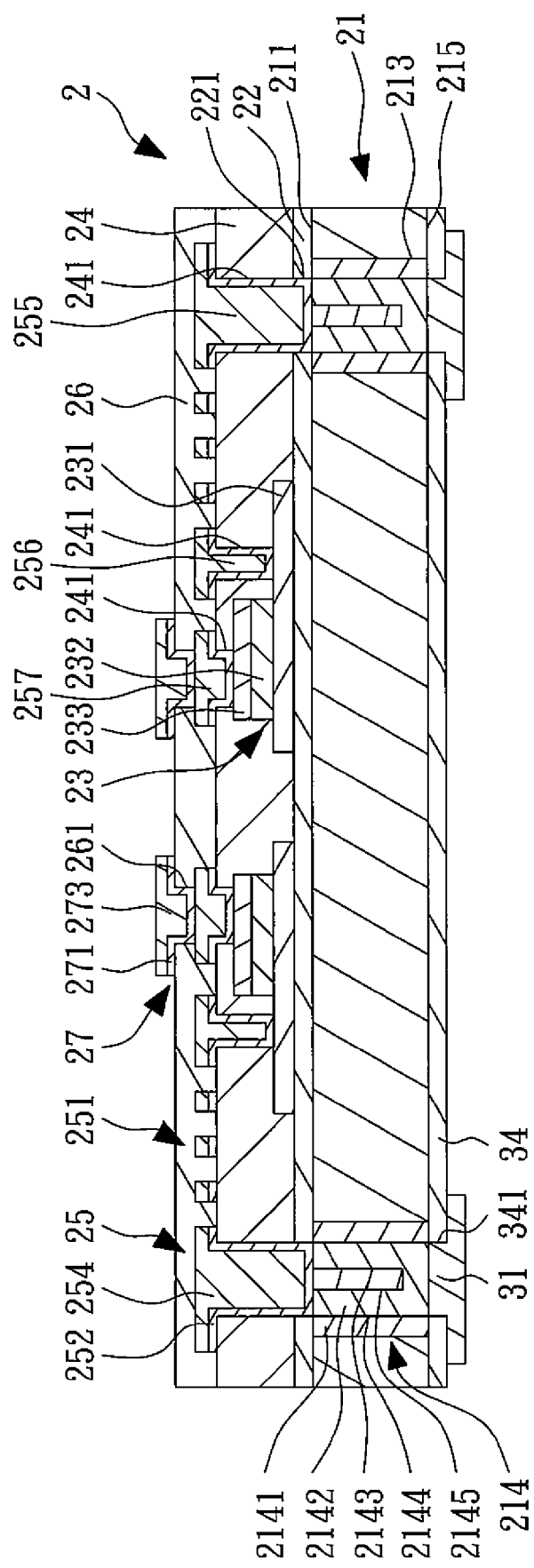

FIGS. 32-34 are schematic views of a fifth embodiment of a method for making a semiconductor package according to the present invention. The method of the fifth embodiment and that (FIGS. 2-21) of the first embodiment are substantially the same, and the same elements are designated with the same numerals. The difference between the fifth embodiment and the first embodiment, as shown in FIG. 32, is that in this embodiment, a base material 21 having a first surface 211, a second surface 215, at least one groove 213 and at least one conductive via structure is provided. The groove 213 penetrates the first surface 211 and the second surface 215. The conductive via structure is disposed in the groove 213 and exposed on the first surface 211 and the second surface 215, so as to form a through via structure 214. Then, as shown in FIG. 33, firstly, a first inductor 251 and a first capacitor 23 are formed on the first surface 211 of the base material 21. As shown in FIG. 34, secondly, at least one electrical device is formed on the second surface 215 of the base material 21, and the semiconductor package 2 is made. However, in other embodiments, the electrical device can first be formed on the second surface 215 of the base material 21, and then the first inductor 251 and the first capacitor 23 are formed on the first surface 211 of the base material 21.

While embodiments of the present invention have been illustrated and described, various modifications and improvements can be made by those skilled in the art. The embodiments of the present invention are therefore described in an illustrative but not restrictive sense. It is intended that the present invention is not limited to the particular forms illustrated, and that all modifications that maintain the spirit and scope of the present invention are within the scope defined in the appended claims.

What is claimed is:

1. A semiconductor package, comprising:
   a base material, having a first surface, a second surface, at least one groove and at least one through via structure, the groove penetrating the first surface and the second surface, and the through via structure being disposed in the groove and exposed on the first surface and the second surface;
   a first capacitor, disposed on the first surface of the base material and comprising a first lower electrode, a first dielectric layer and a first upper electrode, the first lower electrode being disposed on the first surface of the base material, the first dielectric layer being disposed on the first lower electrode, and the first upper electrode being disposed on the first dielectric layer;
   a first protective layer, encapsulating the first capacitor, the first protective layer comprising a plurality of first openings, and the first openings exposing the through via structure, part of the first lower electrode and part of the first upper electrode;
   a first metal layer, disposed on the first protective layer, comprising a first inductor, a first interconnection metal, a second interconnection metal and a third interconnection metal, wherein the first interconnection metal directly contacts the through via structure, the second interconnection metal directly contacts the first lower electrode, and the third interconnection metal directly contacts the first upper electrode; and
   a second protective layer, encapsulating the first inductor.

2. The semiconductor package according to claim 1, wherein the base material is made of silicon, germanium, glass or silica, the first lower electrode and the first upper electrode are made of AlCu, and the first dielectric layer is made of tantalum pentoxide ($Ta_2O_5$).

3. The semiconductor package according to claim 1, wherein the through via structure comprises a conductor, and the groove is filled with the conductor.

4. The semiconductor package according to claim 1, wherein the through via structure comprises a conductor and an inner insulation layer, the conductor is disposed on the side wall of the groove to define a second central groove, and the second central groove is filled with the inner insulation layer.

5. The semiconductor package according to claim 1, wherein the through via structure comprises an outer insulation layer and a conductor, the outer insulation layer is disposed on the side wall of the groove to define a second central groove, and the second central groove is filled with the conductor.

6. The semiconductor package according to claim 1, wherein the through via structure comprises an outer insulation layer, a conductor and an inner insulation layer, the outer insulation layer is disposed on the side wall of the groove to define a second central groove, the conductor is disposed on the side wall of the second central groove so as to define a first central groove, and the first central groove is filled with the inner insulation layer.

7. The semiconductor package according to claim 1, further comprising a first insulation layer, wherein the first insulation layer is disposed on the first surface of the base material and having a first through hole exposing the conductive via structure, the first capacitor is disposed on the first insulation layer, and the first lower electrode is disposed on the first insulation layer.

8. The semiconductor package according to claim 1, further comprising at least one first bump, wherein the second protective layer comprises at least one second opening, and the first bump disposed in the second opening.

9. The semiconductor package according to claim 1, further comprising at least one electrical device disposed on the second surface of the base material.

10. The semiconductor package according to claim 1, wherein the first lower electrode directly contacts the first surface of the base material.

11. The semiconductor package according to claim 7, wherein the first dielectric layer is disposed on the first lower electrode.

12. The semiconductor package according to claim 11, wherein the first upper electrode is disposed on the first dielectric layer.

13. The semiconductor package according to claim 7, further comprising a second insulation layer disposed on the second surface of the base material.

14. The semiconductor package according to claim 13, wherein the second insulation layer has a second through hole exposing the through via structure.

15. The semiconductor package according to claim 1, wherein the first interconnection metal, the second interconnection metal and the third interconnection metal are parts of the first metal layer in the first openings.

16. The semiconductor package according to claim 9, wherein the electrical device is a second inductor, a second capacitor or a second bump.

* * * * *